(12) United States Patent
McCune et al.

(10) Patent No.: US 6,366,177 B1
(45) Date of Patent: Apr. 2, 2002

(54) HIGH-EFFICIENCY POWER MODULATORS

(75) Inventors: Earl W. McCune, Santa Clara; Wendell Sander, Los Gatos, both of CA (US)

(73) Assignee: Tropian Inc., Cupertino, CA (US)

(*) Notice: Subject to any disclaimer, the term of this patent is extended or adjusted under 35 U.S.C. 154(b) by 0 days.

(21) Appl. No.: 09/495,891

(22) Filed: Feb. 2, 2000

(51) Int. Cl.$^7$ .................................................. H03F 3/38
(52) U.S. Cl. ........................ 332/103; 455/63; 455/127; 330/149; 330/285; 330/199
(58) Field of Search ................. 330/285, 149, 330/199, 10, 251; 332/103, 162, 159; 455/127, 108, 63

(56) References Cited

U.S. PATENT DOCUMENTS

| | | | |
|---|---|---|---|
| 3,777,275 A | 12/1973 | Cox | 330/10 |
| 3,900,823 A | 8/1975 | Sokal et al. | |
| 3,919,656 A | 11/1975 | Sokal et al. | 330/51 |
| 4,178,557 A | 12/1979 | Henry | 330/10 |
| 4,367,443 A | 1/1983 | Hull et al. | 330/207 |
| 4,392,245 A | 7/1983 | Mitama | 455/115 |
| 4,717,884 A | 1/1988 | Mitzlaff | 330/251 |
| 4,743,858 A | 5/1988 | Everard | 330/10 |
| 4,804,931 A | 2/1989 | Hulick | 332/31 R |
| 4,831,334 A | 5/1989 | Hudspeth | |
| 4,881,023 A | 11/1989 | Perusse et al. | 323/266 |
| 4,896,372 A | 1/1990 | Weaver | 455/108 |
| 4,972,440 A | 11/1990 | Ernst et al. | |
| 4,992,753 A | 2/1991 | Jenson et al. | 330/129 |
| 4,994,757 A | 2/1991 | Bickley et al. | 330/285 |
| 5,060,294 A | 10/1991 | Schwent et al. | 455/93 |
| 5,095,542 A | 3/1992 | Suematsu et al. | 455/127 |
| 5,126,688 A | 6/1992 | Nakanishi et al. | 330/285 |
| 5,142,240 A | 8/1992 | Isota et al. | |
| 5,175,877 A | 12/1992 | Streeter | 455/102 |
| 5,187,580 A | 2/1993 | Porter, Jr. et al. | 330/207 A |
| 5,193,223 A | 3/1993 | Walczak et al. | 455/115 |
| 5,247,264 A | 9/1993 | Cripe | 330/251 |
| 5,251,330 A | 10/1993 | Chiba et al. | |

(List continued on next page.)

FOREIGN PATENT DOCUMENTS

WO    WO 00/35080    6/2000

OTHER PUBLICATIONS

Chiba et al., Linearized saturation amplifier with bidirectional control (LSA–BC) for digital mobile radio, 1990 IEEE.

*Primary Examiner*—Arnold Kinkead

(57) ABSTRACT

The present invention, generally speaking, incorporates the power amplifier as a fundamental constituent of a modulator, using polar modulation techniques. Thus, it is possible to achieve the combination of precision signal generation (including envelope variations) along with high energy efficiency in combinations not possible heretofore. In accordance with one embodiment of the invention, a modulated radio (passband) signal generator produces high quality signals of general type, which specifically includes signals with varying envelopes. Signals are generated with high energy efficiency in the conversion of applied DC power to output RF signal power. The result is longer battery life for products such as mobile phone handsets. Dramatically improved efficiency also allows for a dramatic reduction (10 to 1 or greater) in the size of any required heatsink for the radio transmitter, which significantly lowers both cost and size. Furthermore, continuous operation of these radio transmitters is made possible with small temperature rises using small heatsinks, or even without any heatsink components. This provides for high operating reliability, as well as for greater throughput due to the longer operating time allowed. Another aspect of the invention allows the generation of high quality signals with wide bandwidth, without the need for continuous feedback during operation. This further reduces costs by greatly simplifying the design, manufacturing, and complexity of the transmitter circuitry.

9 Claims, 6 Drawing Sheets

U.S. PATENT DOCUMENTS

| | | | |
|---|---|---|---|
| 5,268,658 A | 12/1993 | Edwards | 332/151 |
| 5,276,912 A | 1/1994 | Siwiak et al. | 455/73 |
| 5,329,249 A | 7/1994 | Cripps | 330/302 |
| 5,329,259 A | 7/1994 | Stengel et al. | 332/103 |
| 5,369,789 A | 11/1994 | Kosugi et al. | 455/126 |
| 5,410,272 A | 4/1995 | Haberland et al. | 330/129 |
| 5,420,536 A | 5/1995 | Faulkner et al. | |
| 5,430,416 A | 7/1995 | Black et al. | |
| 5,598,436 A | 1/1997 | Brajal et al. | |
| 5,604,924 A | 2/1997 | Yokoya | 455/68 |
| 5,652,546 A | 7/1997 | Dent | 330/276 |
| 5,673,000 A | 9/1997 | Strickland | 330/255 |
| 5,697,072 A | 12/1997 | Shibata | 455/115 |
| 5,697,074 A | 12/1997 | Makikallio et al. | 455/126 |
| 5,705,959 A | 1/1998 | O'Loughlin | |
| 5,745,526 A | 4/1998 | Kumm et al. | |
| 5,825,248 A | 10/1998 | Ozawa | |
| 5,831,475 A | 11/1998 | Myers et al. | |
| 5,847,602 A * | 12/1998 | Su | 330/10 |
| 5,861,777 A | 1/1999 | Sigmon et al. | |
| 5,880,633 A | 3/1999 | Leizerovich et al. | |
| 5,886,572 A | 3/1999 | Myers et al. | |
| 5,920,596 A | 7/1999 | Pan et al. | |
| 5,929,776 A | 7/1999 | Warble et al. | |
| 5,936,464 A | 8/1999 | Grondahl | |
| 5,942,938 A | 8/1999 | Myers et al. | |
| 5,990,735 A | 11/1999 | Sigmon et al. | |
| 6,002,923 A | 12/1999 | Sahlman | |
| 6,043,707 A | 3/2000 | Budnik | |
| 6,047,168 A | 4/2000 | Carlsson et al. | |
| 6,049,703 A | 4/2000 | Staudinger et al. | |
| 6,049,707 A | 4/2000 | Buer et al. | |
| 6,078,628 A | 6/2000 | Griffith et al. | |
| 6,084,468 A | 7/2000 | Sigmon et al. | |
| 6,100,756 A | 8/2000 | Wang et al. | |
| 6,101,224 A | 8/2000 | Lindoff et al. | |
| 6,107,880 A | 8/2000 | Shaw | |
| 6,130,910 A | 10/2000 | Anderson et al. | |
| 6,141,541 A | 10/2000 | Midya et al. | |
| 6,191,653 B1 | 2/2001 | Camp, Jr. et al. | |
| 6,194,963 B1 | 2/2001 | Camp, Jr. et al. | |
| 6,256,482 B1 | 7/2001 | Raab | |

* cited by examiner

HIGH-EFFICIENCY POWER MODULATORS

BACKGROUND OF THE INVENTION

1. Field of the Invention

The present invention relates to radio frequency (RF) power amplifiers.

2. State of the Art

In the area of RF communications, as the desire and need for greater transmission throughput grows, the preferred signals must exhibit high data efficiency. In general, high data efficiency signals exhibit the property of a varying envelope. Such envelope varying signals generally require linear circuit operation.

In a conventional radio transmitter, the modulator and power amplifier (PA) are separate functions, as shown in FIG. 1. The modulator translates the information input to the transmitter into a passband signal, usually at radio frequencies, which can have either a constant envelope (average signal power is equal to peak signal power) or a varying envelope (average signal power is less than peak signal power). It is generally understood in the radio art that circuitry that supports only constant envelope signals can be inherently more energy efficient than circuitry that supports envelope varying signals, since the envelope varying signal requires linear circuit performance. Since the envelope varying signal is more general, this disclosure is focused on the generation of these signals.

It is widely recognized that the desired joint goals of linear operation and high energy efficiency are mutually exclusive, that is, an amplifier with high energy efficiency does not operate in a linear manner, and similarly an amplifier operating in a linear manner does not exhibit high energy efficiency.

Since improving the energy efficiency of a linear amplifier (to 50% or higher) has historically proven to be essentially impossible, most efforts focus on taking a more efficient nonlinear amplifier and improving its linearity. These methods include feedforward linearization, predistortion, feedback predistortion, and modulator feedback. These methods are briefly summarized below.

In the feedforward linearization method shown in FIG. 2, the PA is first characterized as to what distortions to the signal it will generate. The inverse of these distortions is externally generated, and then summed with the output from the PA. This should cancel the distortions from the PA itself, resulting in improved linear operation.

In the predistortion method shown in FIG. 3, again the PA is first characterized as to what distortions to the signal it will generate. The inverse of these distortions is externally generated, and then applied to the input of the PA. The PA should cancel the distortions from the predistorter, resulting in improved linear operation.

In the feedback predistortion method shown in FIG. 4, again the PA is first characterized as to what distortions to the signal it will generate. The inverse of these distortions is externally generated, and then applied to the input of the PA. The PA should cancel the distortions from the predistorter, resulting in improved linear operation. Any errors in the predistortion are sensed at the output of the PA, and used to correct the predistorter. This technique is often called an adaptive predistorter.

Some efforts have begun recently to put continuous feedback around the PA back into the modulator, so that PA errors can be continuously corrected. Shown in FIG. 5, this is an extension of the adaptive predistorter method, where the predistorter function is included within the modulator. Because this is a feedback technique, stability of the feedback loop is of particular concern. Maintaining loop stability is further exacerbated by the inclusion of known nonlinear components (the PA) within the loop. Additionally, the allowable bandwidth of the signal modulation is restricted by the dynamics of the feedback loop. An example of this technique is the combined analog locked-loop universal modulator (CALLUM), described in D. J. Jennings, J. P. McGeehan, "A high-efficiency RF transmitter using VCO derived synthesis: CALLUM," Proceedings of the 1998 IEEE Radio and Wireless Conference (RAWCON), August 1998, pp. 137–140.

The LINC technique (D. C. Cox, "Linear Amplification with Nonlinear Components," IEEE Transactions on Communications, vol. COM-23, December 1974, pp. 1942–5) is an amplifier method that uses nonlinear amplifiers in combination to amplify an envelope-varying signal as shown in FIG. 6. The key is to represent an arbitrary bandpass (radio) signal as the vector sum of two constant envelope phase-modulated signals. The two constant envelope signals are amplified individually in high-efficiency nonlinear amplifiers which are each sized to provide one-half of the peak required output power, and then combined (usually in a passive network) for the final output signal. This combiner must internally dissipate the output power from both nonlinear PAs when the magnitude of the output signal is low. Thus, the LINC technique forfeits much of the inherent efficiency of the individual nonlinear amplifiers.

Another existing approach to amplifying envelope-varying signals with simultaneous high energy efficiency is envelope-elimination and restoration (EER), described in D. K. Su, W. J. McFarland, "An IC for Linearizing RF Power Amplifiers Using Envelope Elimination and Restoration," IEEE Journal of Solid-State Circuits, vol. 33, December 1998, pp. 2252–2258. The EER technique, like the LINC technique, is for a separate amplifier following the modulator as shown in FIG. 7. The EER amplifier must first demodulate the amplitude variations from the applied input signal, then limit the input signal for amplification in a nonlinear (preferably switch-mode) amplifier. Envelope restoration is achieved in the final output stage. A feedback loop is often used around the envelope restoration process to more closely match the output signal envelope with the measured envelope from the input signal. As with any feedback control loop, the loop dynamics restrict the achievable modulation bandwidth.

There remains a need to enable the generation of radio communication signals at a power suitable for transmission while simultaneously exhibiting high DC-to-RF conversion efficiency. Further, the quality of the signal so generated must meet often stringent performance specifications, such as the GSM-EDGE specifications.

SUMMARY OF THE INVENTION

The present invention, generally speaking, incorporates the power amplifier as a fundamental constituent of a modulator, using polar modulation techniques. Thus, it is possible to achieve the combination of precision signal generation (including envelope variations) along with high energy efficiency in combinations not possible heretofore. In accordance with one embodiment of the invention, a modulated radio (passband) signal generator produces high quality signals of general type, which specifically includes signals with varying envelopes. Signals are generated with high energy efficiency in the conversion of applied DC power to output RF signal power. The result is longer battery life for products such as mobile phone handsets. Dramatically improved efficiency also allows for a dramatic reduction (10 to 1 or greater) in the size of any required heatsink for the radio transmitter, which significantly lowers both cost and size. Furthermore, continuous operation of these radio transmitters is made possible with small temperature rises using small heatsinks, or even without any heatsink components. This provides for high operating reliability, as well as for greater throughput due to the longer operating time allowed. Another aspect of the invention allows the generation of high quality signals with wide bandwidth, without the need for continuous feedback during operation. This further reduces costs by greatly simplifying the design, manufacturing, and complexity of the transmitter circuitry.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
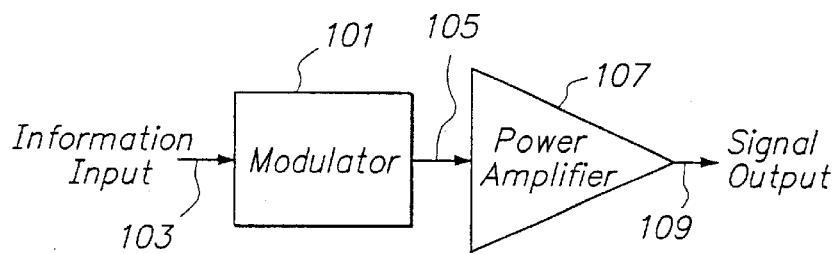
FIG. 1 is a block diagram showing a standard configuration of a radio transmitter.
Figure 2:
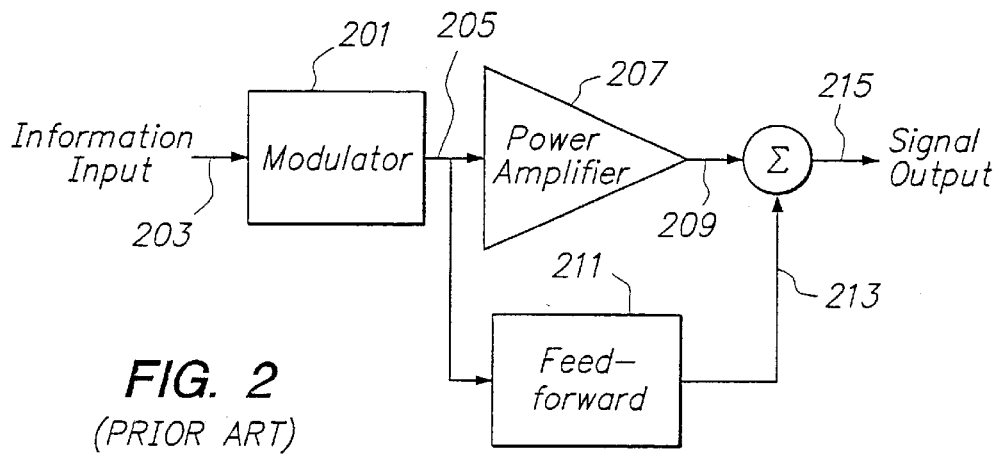
FIG. 2 is a block diagram showing a feed-forward linearizer for a known Power Amplifier (PA).
Figure 3:
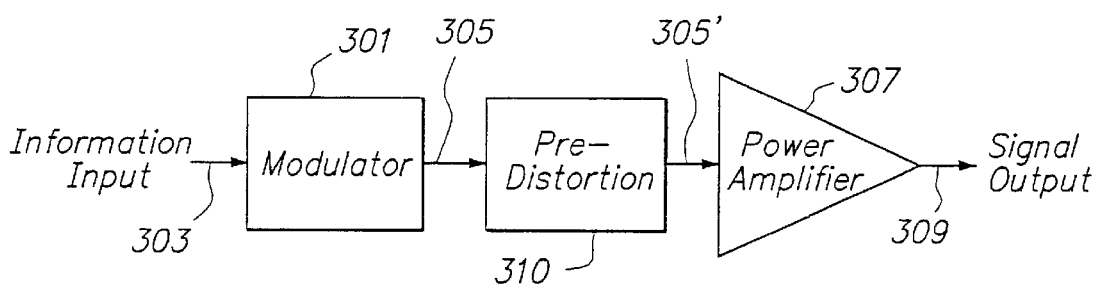
FIG. 3 is a block diagram showing a conventional input pre-distorter for linearizing a power amplifier.
Figure 4:
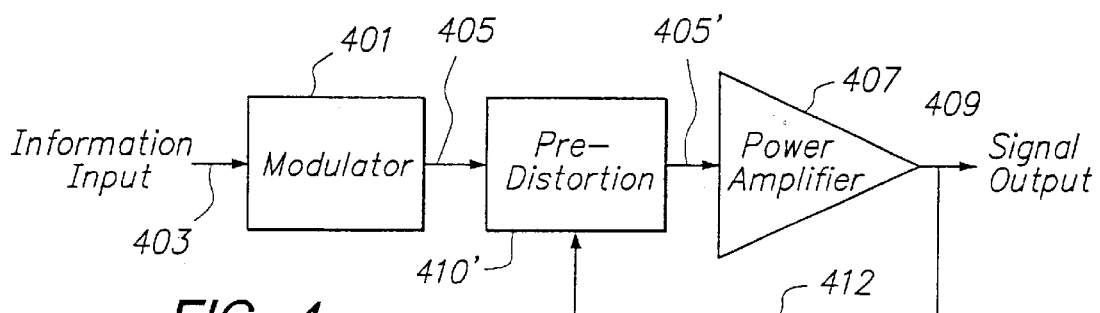
FIG. 4 is a block diagram showing a known feedback pre-distorter for linearizing a power amplifier.
Figure 5:
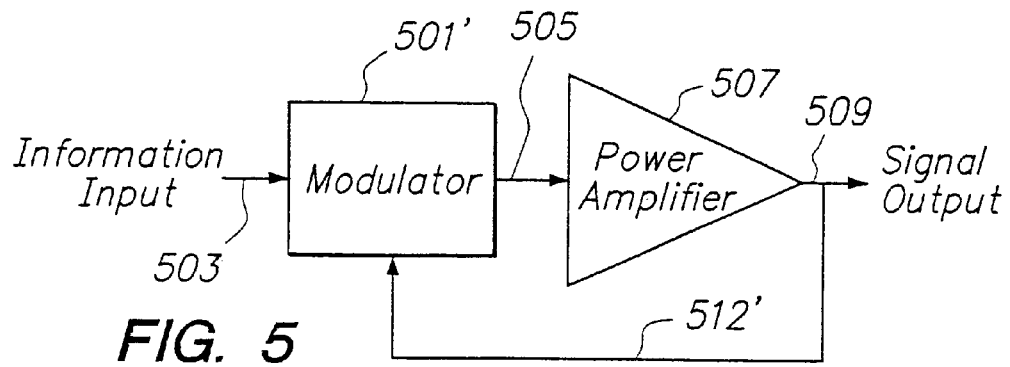
FIG. 5 is a block diagram of a known power amplifier using modulator feedback.
Figure 6:
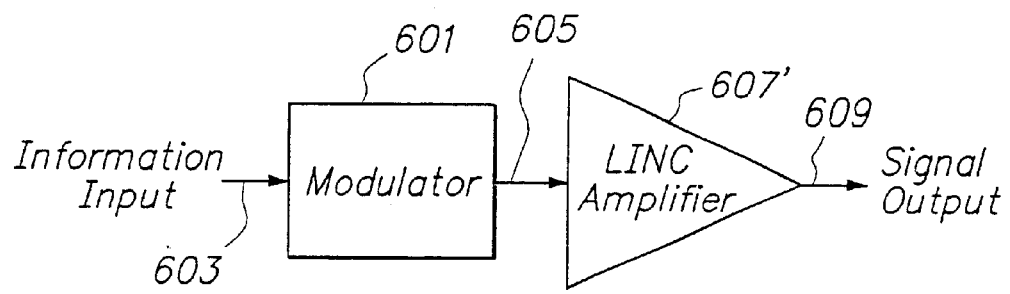
FIG. 6 is a block diagram of an amplifier using the known LINC technique.
Figure 7:
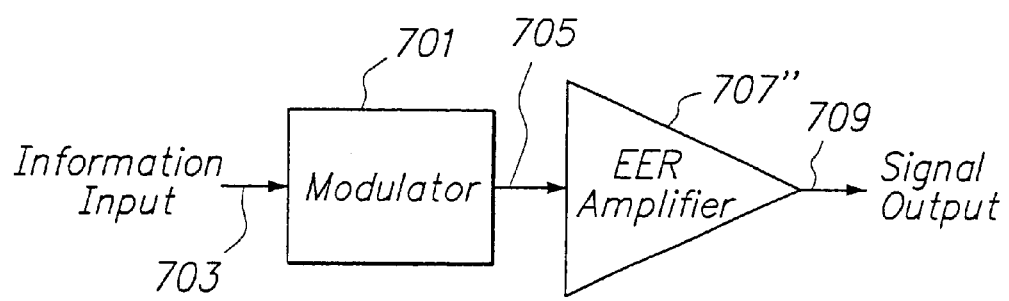
FIG. 7 is a block diagram of an amplifier using the known EER amplifier technique.

The current invention is based on the realization that to meet the stated objectives, the standard architecture of FIG. 1 is insufficient. Rather, it is necessary to include the PA as a fundamental part of the modulator. This means that not only is the first location where the modulated signal exists at the output of the PA, at full desired transmit power, but also that the PA actually must perform part of the modulation.

Figure 8:
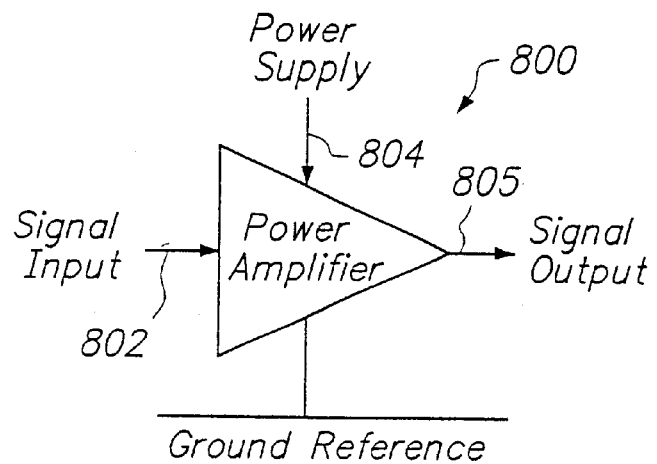
FIG. 8 is a block diagram showing a three-port model of a power amplifier.

In order to achieve this, it is essential to recognize that any PA is actually a three-port device, with two input ports and one output port This new PA operational model is shown in FIG. 8. Each input port has its own transfer function to the output. Further, the two transfer functions may be correlated or independent, depending on the design class of the power amplifier.

For example, using a linear class-A PA there is a very weak relationship between the power supply port and the output signal port, while there is a strong relationship between the input signal port magnitude and phase and the output signal port magnitude and phase (the designed amplifier characteristic). At the other extreme, for a switch-mode PA such as class-E there is a very weak relationship between the input signal port magnitude and the output signal port magnitude. There is a strong relationship between the input signal port phase and the output signal port phase, and another strong relationship between the power supply port and the output signal port magnitude.

It is also noted that an overdriven linear amplifier, such as class-A, which is near or at saturation, exhibits transfer relationships very similar to switch-mode amplifiers. The current invention takes advantage of a strong relationship between the power supply port and the output signal port magnitude, and so it works preferably with nonlinear PAs (switch-mode or saturated preferred, class-C to some extent). This naturally enhances energy efficiency of the overall system, in that these nonlinear amplifiers are maximally energy efficient.

This strong relationship between the power supply port and the output signal port magnitude is used to control the magnitude of the output signal. With this ability to directly and independently control the output signal magnitude, it is therefore natural to consider the overall modulation operation in polar coordinates. This is significantly different from the widely-adopted conventional use of cartesian coordinates through the use of quadrature modulators.

Figure 9:
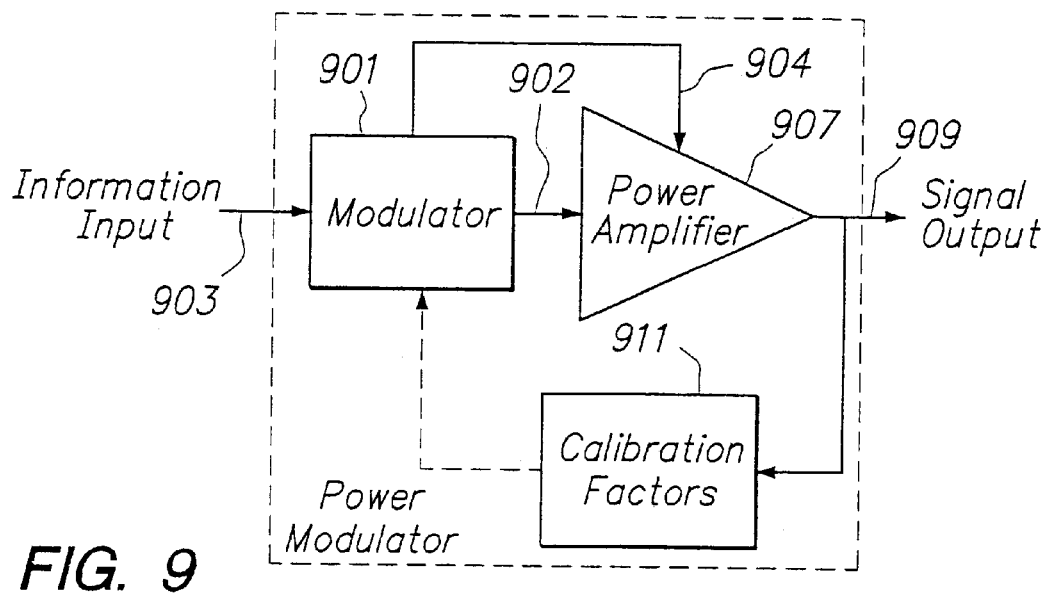
FIG. 9 is a block diagram of a Power Modulator in accordance with one embodiment of the present invention, with PA calibration measurement.

A preferred embodiment of the current invention is shown in FIG. 9. An information input is applied to a modulator driver, which drives the two input ports of the power amplifier, causing it to produce the desired output signal. Optionally, the output signal may be measured in order to retrieve an appropriate calibration factor from a table of calibration factors. The calibration factor is applied to the modulator driver to correct the signal output. After a one-time calibration procedure has been performed in which the performance of the power amplifier is observed and appropriate correction factors computed and stored, the same correction factors can be used to produce an appropriate control value each time a control value is used to control the power amplifier.

For many applications this power polar modulation system can operate directly in feedforward mode, since the perturbations of magnitude compression (AM-AM) and cross-modulation (AM-PM) are small. For applications requiring greater precision, these small perturbations can be automatically and independently measured and stored as calibration factors. The calibration factors are then applied to the appropriate direct modulation paths and the polar power modulator continues to operate in a feedforward manner.

There are two particular contributions to this method of correction. First, it is not a closed-loop feedback system, so that the modulation bandwidths achievable by the power modulator are not restricted by loop dynamics of such a feedback system. And second, the complexity of the system is greatly reduced from that used in existing systems such as CALLUM. This is due to the independent nature of the corrections in the present invention: correcting phase has no effect on output signal magnitude, and correcting magnitude has no effect on output signal phase. The correction is a set of two one-dimensional processes. This situation is unlike the cartesian system, when a signal magnitude or phase error affects both the I and Q modulation signals, which is a two-dimensional process It is well understood that two independent one-dimensional processes are much simpler to implement than one two-dimensional correlated process.

Figure 10:
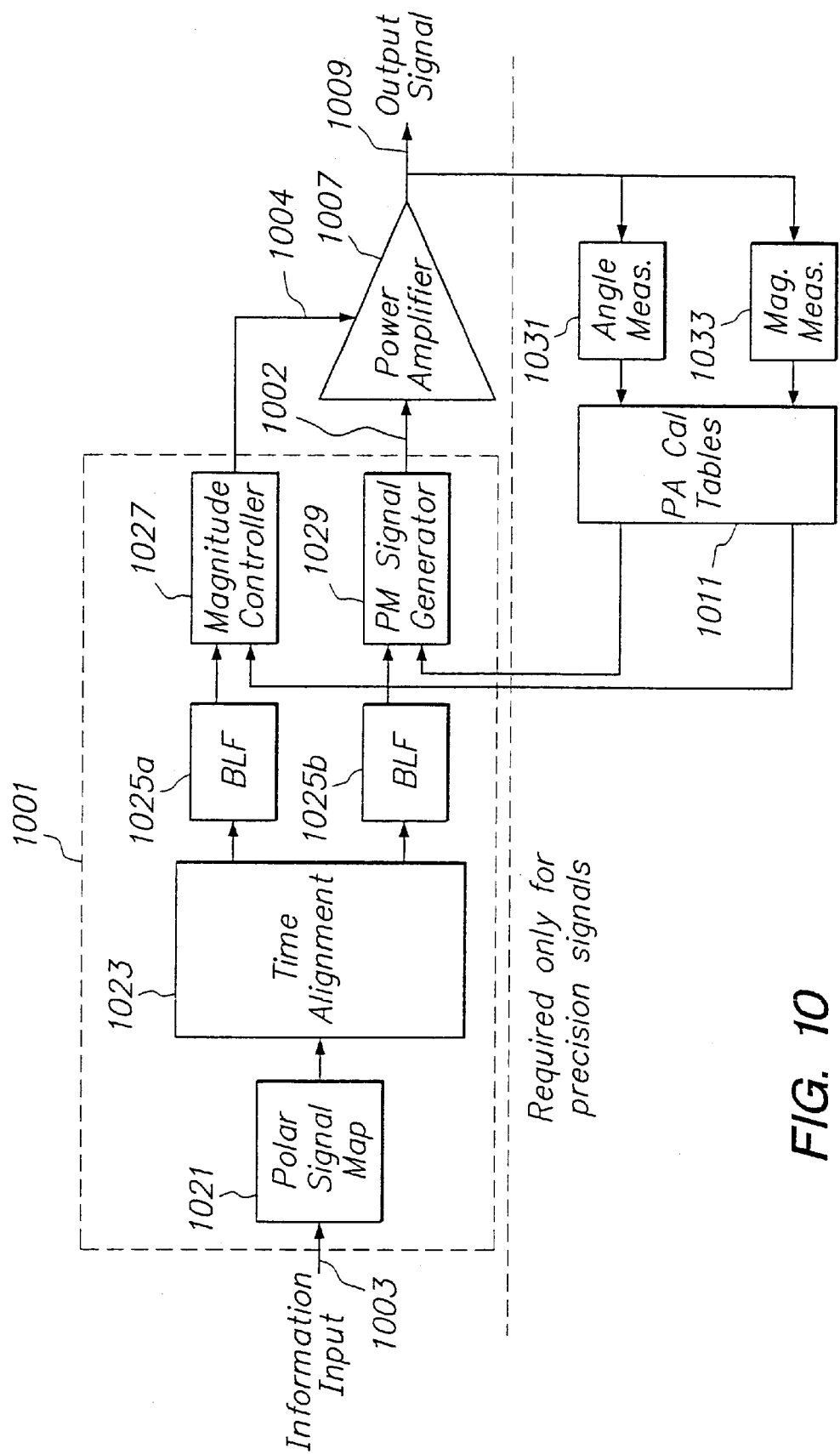
FIG. 10 is a block diagram showing further details of one embodiment of the power modulator.

FIG. 10 shows a preferred embodiment of the Power Modulator. It employs a polar signal map (PSM) to transform the information input into signal magnitudes and phases. An example of a PSM for the square 16QAM signal is shown in Table 1. These magnitudes and phases are passed through a time alignment (TA) block so that the alignment of the phase modulated signal and the magnitude control signal at the Power Amplifier (PA) is precise (to account for delay differences between the two paths). These signals are passed through bandlimiting filters (BLF) to control the occupied bandwidth of the output signal. The output of the magnitude BLF is passed through a magnitude controller to set the magnitude of the output signal. This method is similar to the method disclosed in U.S. patent application Ser. No. 09/247,095 filed Feb. 9, 1999 (Attys. Dkt. No. 03219-013), incorporated herein by reference. If necessary, correction for AM-AM distortion can also be included here. The output of the angle BLF is used to control a phase modulated signal generator (such as that taught in U.S. Pat. No. 5,952,895, incorporated herein by reference). The output of the PM signal generator is applied to the RF input of the PA to set the phase of the output signal. If necessary, correction for AM-PM distortion can also be included here.

For precision signal generation, cross-modulation (AM-PM distortion) and magnitude compression (AM-AM distortion) in the PA may need to be corrected. Since both of these effects are dependent on the actual output signal magnitude, a recommended calibration procedure would be to: 1) generate a signal to be applied to the input of the PA with a fixed (constant) phase modulation, 2) apply this signal to the PA, 3) set the output magnitude to its maximum value, 4) measure the actual phase of the PA output signal, preferably using a simple direct digital phase quantizer such as that disclosed in U.S. patent application Ser. No. 08/947,027 now U.S. Pat. No. 6,219,394 and U.S. patent application Ser. No. 09/006,938, now U.S. Pat. No. 6,269,135 filed Oct. 8, 1997 and Jan. 14, 1998, respectively (Attys. Dkt. Nos. 032219-002 and 032219-003), incorporated herein by reference, 5) measure the actual magnitude of the PA output signal, using means such as detector diodes or detecting log-arithmic amplifiers, 6) store the measured angle and magnitude values in a memory, 7) lower the magnitude control, and 8) repeat the measurement and storage process.

TABLE 1

Polar Signal Map for Square 16 QAM

| Symbol | mag. | phase (deg) |
|---|---|---|
| 0 | 0.333 | 45.0 |
| 1 | 0.745 | 71.6 |
| 2 | 0.333 | −45.0 |
| 3 | 0.745 | −71.6 |
| 4 | 0.745 | 18.4 |
| 5 | 1.000 | 45.0 |
| 6 | 0.745 | −18.4 |
| 7 | 1.000 | −45.0 |
| 8 | 0.333 | 135 |
| 9 | 0.745 | 108.4 |
| A | 0.333 | −135.0 |
| B | 0.745 | −108.4 |
| C | 0.745 | 161.6 |
| D | 1.000 | −135.0 |
| E | 0.745 | −161.6 |
| F | 1.000 | −135.0 |

Figure 11:
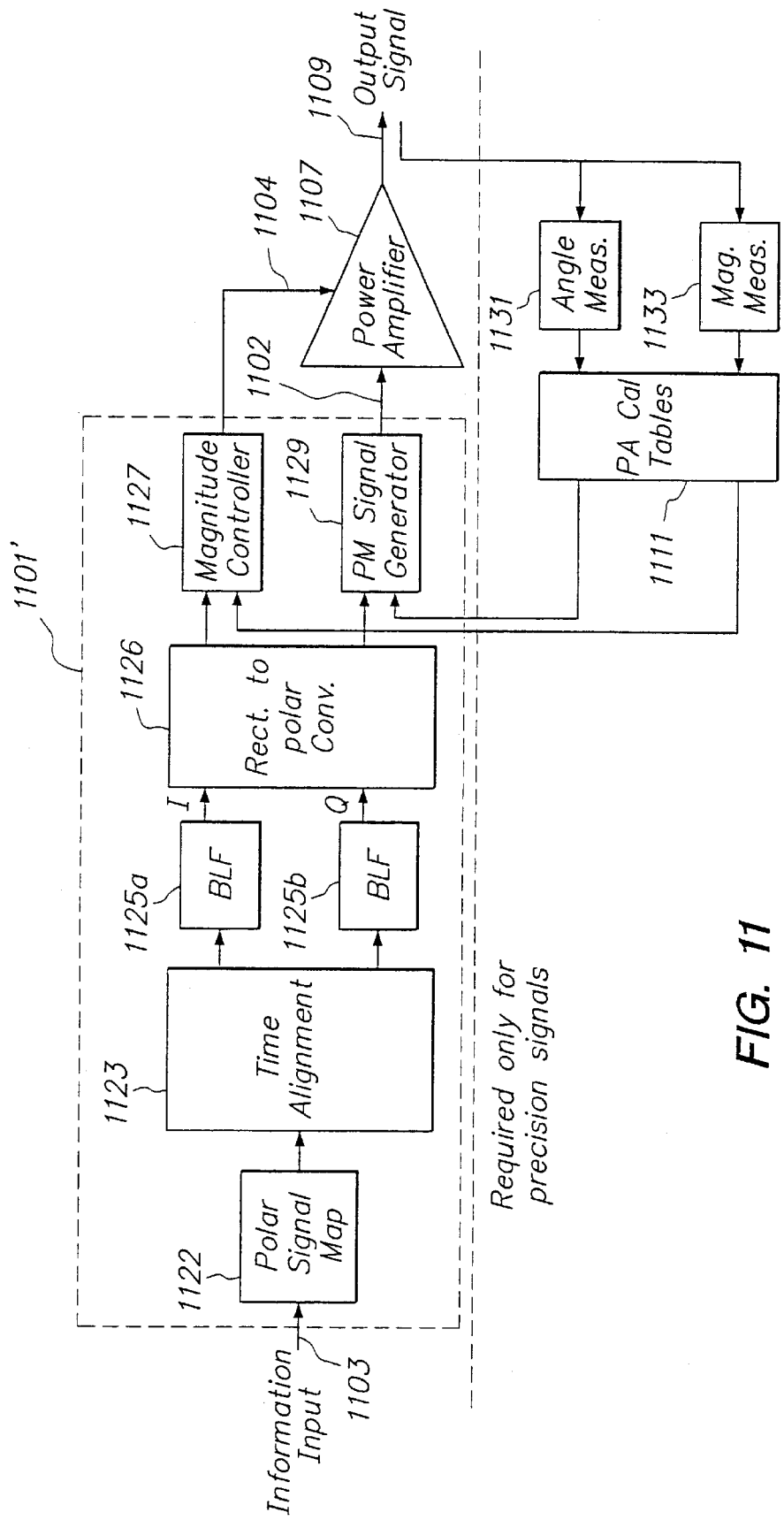
FIG. 11 is a block diagram of a power modulator using a quadrature (rectangular) modulation mapper.

Though the use of polar techniques is the preferred embodiment, this invention is compatible with conventional signal maps. This is shown in FIG. 11, and an equivalent signal map to Table 1 using quadrature coordinates is presented in Table 2.

TABLE 2

Cartesian Signal Map for Square 16 QAM

| Symbol | x | y |
|---|---|---|
| 0 | 0.236 | 0.236 |
| 1 | 0.236 | 0.707 |
| 2 | 0.236 | −0.236 |
| 3 | 0.236 | −0.707 |
| 4 | 0.707 | 0.236 |
| 5 | 0.707 | 0.707 |
| 6 | 0.707 | −0.236 |
| 7 | 0.707 | −0.707 |
| 8 | −0.236 | 0.236 |
| 9 | −0.236 | 0.707 |
| A | −0.236 | −0.236 |
| B | −0.236 | −0.707 |
| C | −0.707 | 0.236 |
| D | −0.707 | 0.707 |
| E | −0.707 | −0.236 |
| F | −0.707 | −0.707 |

Figure 12:
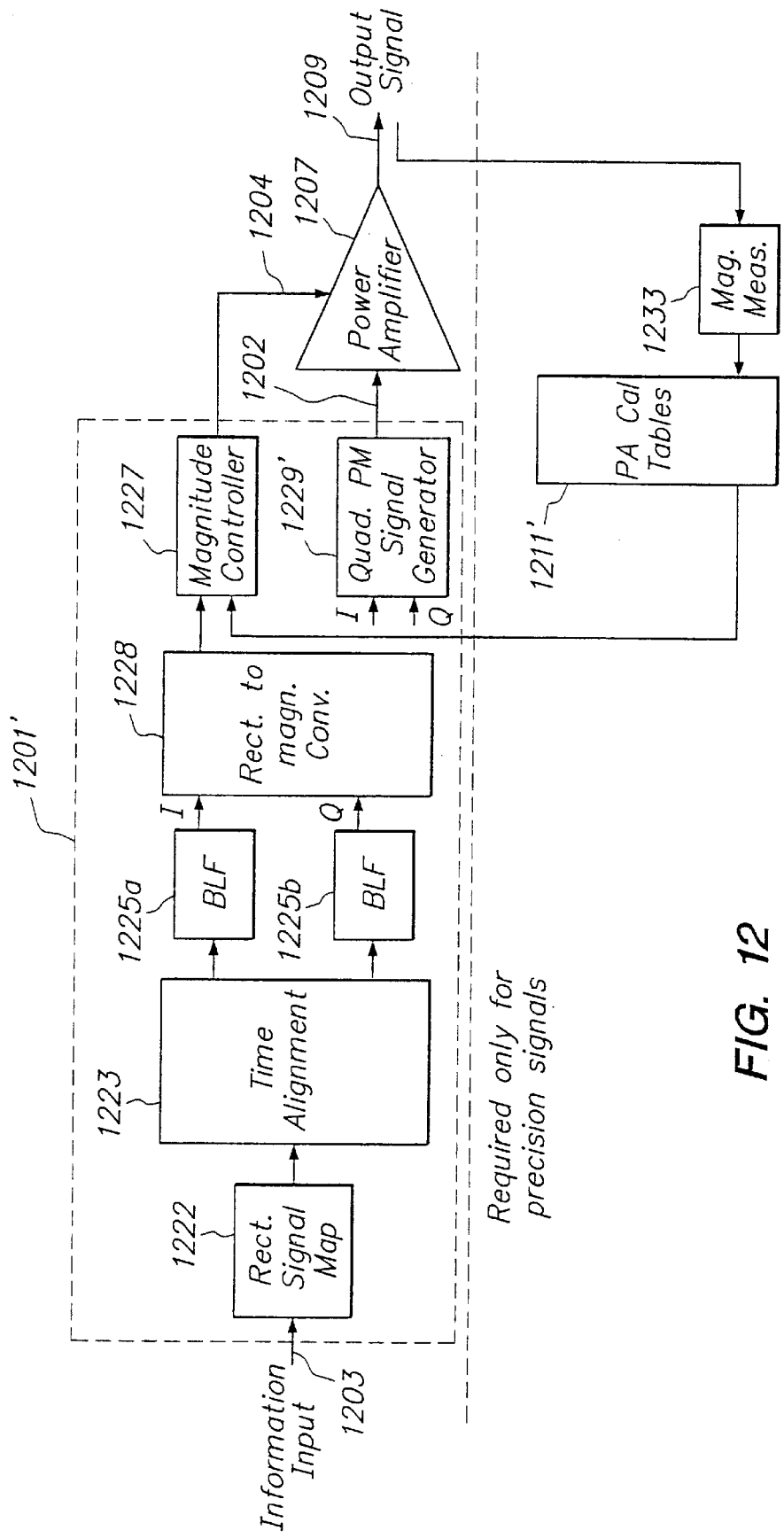
FIG. 12 is another block diagram of a power modulator using a quadrature (rectangular) modulation mapper.

Further, a quadrature modulator can be used in the generation of the phase modulated signal. This is shown in FIG. 12. Due to the difficulty of precise phase control in a quadrature modulator, along with the usual inability of the quadrature modulator to independently adjust the phase of its output signal, this option is usually not used when AM-PM correction is required.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An RF power modulator, comprising:
   a three-port power amplifier having a signal input, a signal output, and a power supply input that is varied in a controlled manner;
   a modulator driver responsive to an information input for producing an input signal applied to the signal input of the three-port power amplifier and a controlled power supply source applied to the power supply input, wherein the modulator driver comprises a signal map responsive to an information signal for producing at least first and second quantities, a phase modulation signal generator responsive to at least one of the quantities for producing an input signal of the three-port power amplifier, and a magnitude controller responsive to at least one of the quantities for producing the controlled power supply source;
   means for producing a calibration factor derived from a measurement of at least one characteristic of an output signal of the three-port power amplifier, the calibration factor being applied to the modulator driver, causing at least one of the input signal and the controlled power supply source to be varied;
   wherein the three-port power amplifier is driven repeatedly between two states, a hard-on state and a hard-off state, without operating the amplifier in a linear operating region for an appreciable percentage of time, thereby producing an RF output signal, the modulator driver and the calibration circuitry operating in an open-loop manner with respect to the RF output signal.

2. The power modulator of claim 1, wherein the signal map is a polar signal map, and the quantities include a magnitude quantity and an angle quantity.

3. The power modulator of claim 1, wherein the signal map is a rectangular signal map, further comprising means for performing rectangular to polar conversion, thereby producing a magnitude quantity and an angle quantity.

4. The power modulator of claim 1, wherein the first and second quantities are I and Q signals, and wherein the phase modulation signal generator is responsive to the I and Q signals to produce the input signal.

5. The power modulator of claim 1, further comprising time alignment means for causing the magnitude quantity and the angle quantity to occur in specified time alignment relative to each other.

6. The power modulator of claim 1, further comprising a first band limiting filter in a signal path of the magnitude quantity and a second band limiting filter in a signal path of the angle quantity.

7. The power modulator of claim 1, comprising first and second calibration loops, each including means for measuring at least one characteristic of an output signal of the three-port power amplifier.

8. The power modulator of claim 7, wherein one calibration loop performs angle calibration and another calibration loop performs magnitude calibration.

9. The power modulator of claim 8, wherein the calibration loop for performing angle calibration includes a direct digital phase quantizer.

* * * * *